US006859223B2

(12) United States Patent
Shirota et al.

(10) Patent No.: US 6,859,223 B2
(45) Date of Patent: Feb. 22, 2005

(54) PATTERN WRITING APPARATUS AND PATTERN WRITING METHOD

(75) Inventors: Hiroyuki Shirota, Kyoto (JP); Akira Kuwabara, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 111 days.

(21) Appl. No.: 10/430,302

(22) Filed: May 7, 2003

(65) Prior Publication Data

US 2003/0222966 A1 Dec. 4, 2003

(30) Foreign Application Priority Data

May 30, 2002 (JP) .................................... P2002-157697
Jan. 21, 2003 (JP) .................................... P2003-011816

(51) Int. Cl.[7] .......................... H01L 21/00; G03F 7/22; B41J 2/447

(52) U.S. Cl. ....................................... 347/239; 347/255

(58) Field of Search ................................ 347/239, 255, 347/241, 256; 355/53, 54, 67; 250/492.1, 492.2

(56) References Cited

U.S. PATENT DOCUMENTS

| | | | |
|---|---|---|---|
| 5,049,901 | A | 9/1991 | Gelbart |
| 5,291,329 | A | 3/1994 | Wakimoto et al. |
| 6,133,986 | A | 10/2000 | Johnson |
| 6,251,550 | B1 | 6/2001 | Ishikawa |
| 6,288,830 | B1 | 9/2001 | Kinoshita |
| 6,425,669 | B1 | 7/2002 | Mei et al. |
| 6,473,237 | B2 | 10/2002 | Mei |
| 6,493,867 | B1 | 12/2002 | Mei et al. |
| 6,537,738 | B1 | 3/2003 | Mei et al. |
| 2003/0214644 | A1 * | 11/2003 | Shirota et al. ................ 355/67 |

FOREIGN PATENT DOCUMENTS

| | | |
|---|---|---|
| EP | 0 528 285 A1 | 2/1993 |
| EP | 0 556 591 | 8/1993 |
| JP | 62-21220 | 1/1987 |
| JP | 6-55776 | 3/1994 |
| JP | 06-083023 | 3/1994 |
| JP | 6-100829 | 12/1994 |
| JP | 2710519 | 10/1997 |
| JP | 2717035 | 11/1997 |
| JP | 10-112579 | 4/1998 |
| JP | 2875125 | 1/1999 |
| JP | 11-320968 | 11/1999 |
| JP | 2001-500628 A | 1/2001 |
| JP | 2001-133893 | 5/2001 |
| JP | 3254248 | 11/2001 |

* cited by examiner

*Primary Examiner*—Huan Tran
(74) *Attorney, Agent, or Firm*—McDermott Will & Emery LLP

(57) ABSTRACT

An image recording apparatus (1) has a stage unit (2) for holding a substrate (9), an irradiation unit (4) having a plurality of irradiation parts (40) and a mechanism for relatively moving the stage unit (2) and the irradiation unit (4). An irradiation part (40) is provided with a DMD having a group of micromirrors for modulating a reflected light beam and a micro moving mechanism for moving the DMD relatively to the irradiation unit (4) in the X direction, thereby microscopically moving an irradiation position of the irradiation part (40) in the X direction. The irradiation part (40) is further provided with a zoom lens, thereby magnifying and reducing an image of the DMD on the substrate (9). By controlling a plurality of irradiation parts (40) parallelly and independently, the image recording apparatus (1) can write a fine pattern at high speed.

20 Claims, 15 Drawing Sheets

F/G. 1

F/G. 2

F/G. 5
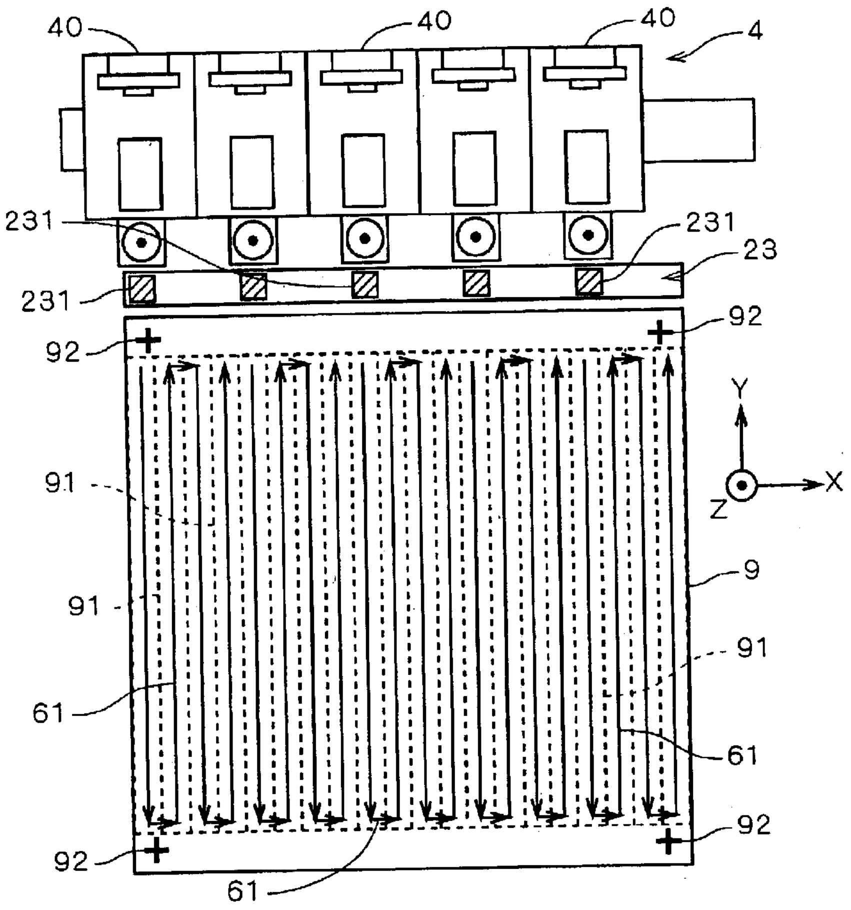

F/G. 10

F/G. 15
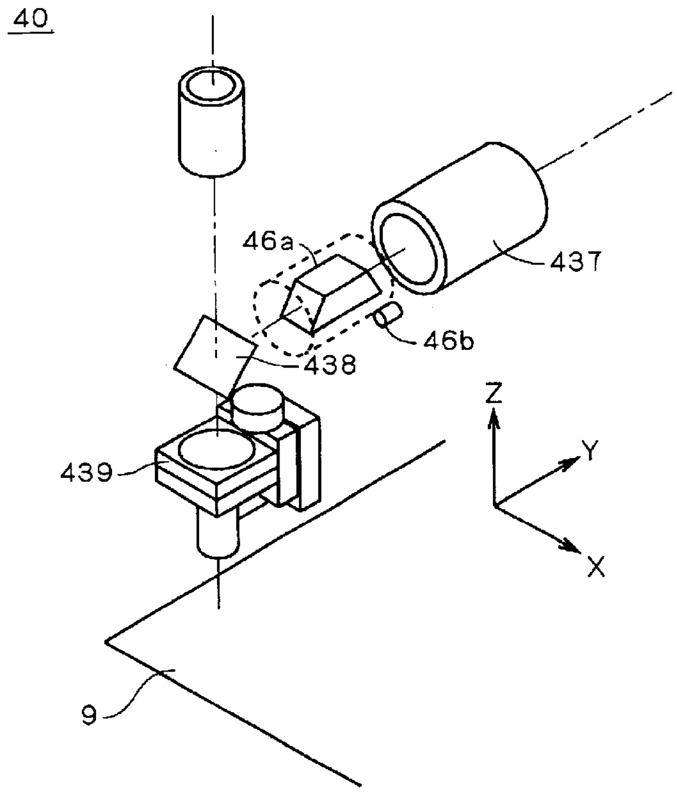
F/G. 16
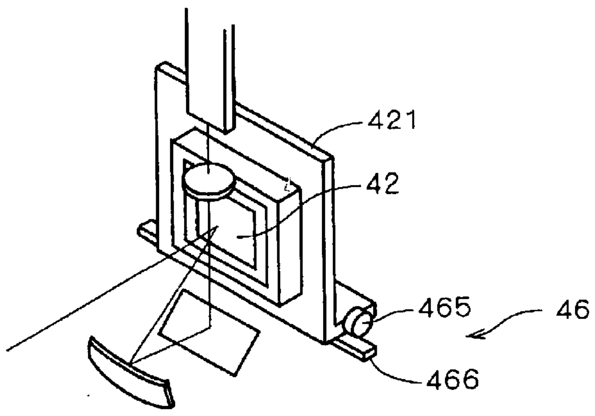

PATTERN WRITING APPARATUS AND PATTERN WRITING METHOD

BACKGROUND OF THE INVENTION

1. Field of the Invention

The present invention relates to a pattern writing apparatus for recording an image on a photosensitive material.

2. Description of the Background Art

Conventionally well known is a technique for irradiating a photoresist film formed on a semiconductor substrate, a printed board, a glass substrate for photomask or the like (hereinafter, referred to as "substrate") with a light beam modulated by a spatial light modulator such as a DMD (digital micromirror device) or a liquid crystal shutter, to write a fine pattern (i.e., record an image).

Japanese Patent Application Laid Open Gazette No. 62-21220 discloses a method to expose a fine pattern, by irradiating a photosensitive material with a light beam spatially modulated by a group of micromirrors of a DMD while feeding the photosensitive material at only a set distance and controlling a signal for the DMD.

Though a technique for pattern writing, which uses only one spatial light modulator, is conventionally proposed, it takes a long time to write a pattern which widely extends when only one spatial light modulator is used. For high-speed writing, use of a plurality of spatial light modulators is considered, but in a case of writing a fine pattern, if a plurality of spatial light modulators are simply arranged for use, it is not easy to join images written on the photosensitive material by the spatial light modulators.

In other words, recently, with refinement of patterns to be formed, a microscopic deformation of a substrate, a microscopic deviation of a substrate holding position or the like greatly affects the precision of written pattern, and due to such an ill effect, it has been conventionally impossible to write a fine pattern at high speed.

SUMMARY OF THE INVENTION

It is an object of the present invention to write a high precision fine pattern at high speed, and the present invention is intended for a pattern writing apparatus for writing a pattern by irradiating a photosensitive material with light modulated on the basis of image data.

According to the present invention, the pattern writing apparatus comprises an irradiation unit which comprises a plurality of irradiation parts for irradiating a photosensitive material with a plurality of light beams each of which is modulated, a scanning mechanism for scanning the photosensitive material relatively to the irradiation unit while the photosensitive material is irradiated with the plurality of light beams, and an irradiation position control mechanism for changing intervals of a plurality of irradiation positions corresponding to the plurality of irradiation parts in a direction almost orthogonal to a scan direction of the photosensitive material.

By changing the intervals of the plurality of irradiation positions, it is thereby possible to record an image with high precision at high speed.

Preferably, the irradiation position control mechanism moves the plurality of irradiation positions independently from one another.

According to an aspect of the present invention, the pattern writing apparatus further comprises a mechanism for moving the irradiation unit in a direction almost orthogonal to the scan direction of the photosensitive material.

According to another aspect of the present invention, in the pattern writing apparatus, each of the plurality of irradiation parts comprises a zoom lens and the zoom lens can be controlled independently from those of other irradiation parts.

It is thereby possible to magnify and reduce a pattern.

According to still another aspect of the present invention, in the pattern writing apparatus, each of the plurality of irradiation parts comprises a light source, a spatial light modulator for spatially modulating light from the light source, and an optical system for guiding a light beam from the spatial light modulator to the photosensitive material. Further, the irradiation position control mechanism comprises a mechanism for moving at least the spatial light modulator relatively to the irradiation unit.

According to yet another aspect of the present invention, in the pattern writing apparatus, the irradiation position control mechanism comprises a mechanism for individually rotating a projected image of the spatial light modulator formed on the photosensitive material with a light beam emitted from each of the plurality of irradiation parts.

It is thereby possible to record an image without rotating the photosensitive material.

According to a further aspect of the present invention, the pattern writing apparatus further comprises a photoreceptor for receiving the light from at least one of the plurality of irradiation positions, and the photoreceptor receives light from at least two positions on the photosensitive material irradiated with light beams and the irradiation position control mechanism is controlled on the basis of an output of the photoreceptor.

Preferably, a positional relation between the plurality of irradiation positions and the irradiation unit is checked also on the basis of the output of the photoreceptor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a view showing a structure used for explaining the operation of the pattern writing apparatus;

FIG. 15 is a view showing another exemplary structure of the irradiation part;

FIG. 16 is a view showing a structure of a microrotation mechanism; and

DESCRIPTION OF THE PREFERRED EMBODIMENTS

Figure 1:
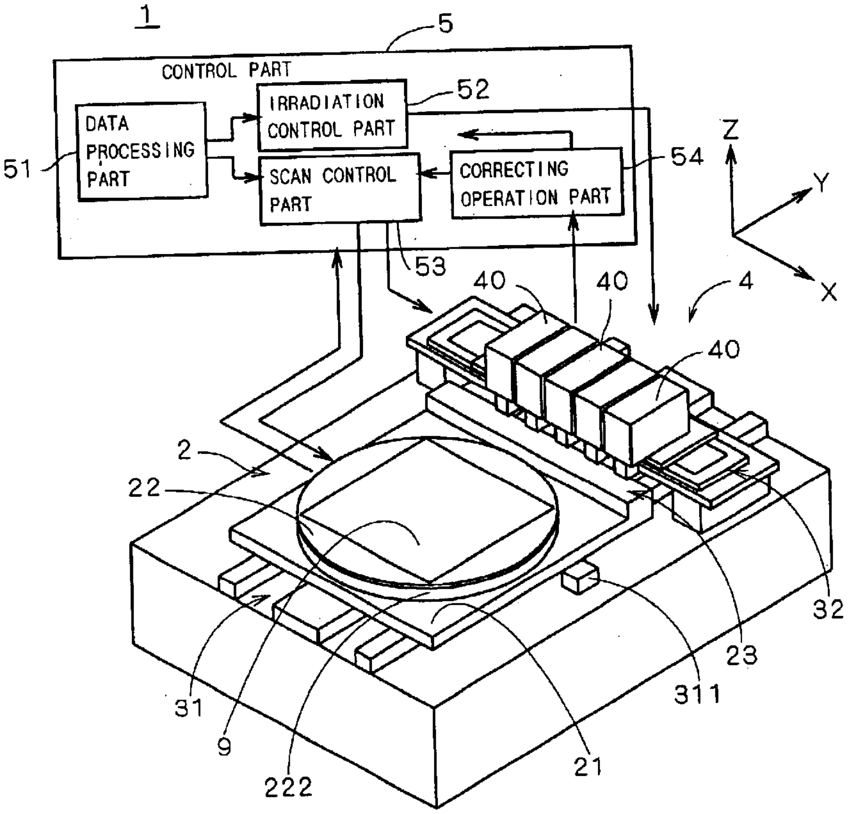
FIG. 1 is a view showing an overall structure of a pattern writing apparatus.

FIG. 1 is a view showing an overall structure of a pattern writing apparatus 1 in accordance with a preferred embodiment of the present invention. The pattern writing apparatus 1 records an image by irradiating a photosensitive material with light beams modulated on the basis of data of an inputted image (in other words, write a pattern by exposure). The pattern writing apparatus 1 comprises a stage unit 2 for holding a substrate 9 on which a photoresist film is formed, a stage moving mechanism 31 for moving the stage unit 2 in the Y direction of FIG. 1, an irradiation unit 4 having a plurality of irradiation parts 40 each for emitting a modulated light beam to the substrate 9, an irradiation unit moving mechanism 32 for moving the irradiation unit 4 in the X direction of FIG. 1 and a control part 5 connected to the stage moving mechanism 31, the irradiation unit 4 and the irradiation unit moving mechanism 32.

The stage unit 2 has a stage support mount 21 and a stage 22 for holding the substrate 9, and an upper surface of the stage 22 is a vacuum for the substrate 9. Between the stage support mount 21 and the stage 22, a stage rotation mechanism 222 is provided to rotate the stage 22 about an axis in the Z direction of FIG. 1 by a very small angle, by which the substrate 9 on the stage 22 is rotated at a small angle about an axis perpendicular to its main surface. On a region 23 on the stage support mount 21 shown in FIG. 1, irradiation position correcting marks discussed later are provided.

The stage support mount 21 is fixed to a moving part of the stage moving mechanism 31 which is a linear motor, and the control part 5 controls the stage moving mechanism 31 to move the substrate 9 in the Y direction (main scan direction) of FIG. 1. A linear encoder 311 is further attached to the stage moving mechanism 31, to detect a scanning position of the stage unit 2 in the main scan direction (a position of the stage 22 with respect to coordinates fixed to the pattern writing apparatus 1) and output a position detecting signal indicating the scanning position to the control part 5.

The irradiation unit 4 is fixed to a moving part of the irradiation unit moving mechanism 32 and is moved by the irradiation unit moving mechanism 32 in a subscan direction (the X direction of FIG. 1) almost orthogonal to the main scan direction. In pattern writing discussed later, the irradiation unit moving mechanism 32 moves the irradiation unit 4 to a start point of the next main scan (in other words, performs a subscan) every time when the moving of the substrate 9 in the Y direction (i.e., the main scan direction) is finished.

Thus, in the pattern writing apparatus 1, the irradiation unit 4 can be moved relatively to the stage unit 2 in the X and Y directions of FIG. 1 and a plurality of regions on the substrate 9 which are irradiated with lights from a plurality of irradiation parts 40 are thereby scanned in the X and Y directions with respect to the substrate 9.

The control part 5 has a data processing part 51, an irradiation control part 52 and a scan control part 53, and data of an image generated by CAD or the like is converted into writing data in the data processing part 51. The converted writing data is transmitted to the irradiation control part 52 and the scan control part 53. The irradiation control part 52 converts the writing data into raster data, and emission of light from each irradiation part 40 is controlled in accordance with the raster data. The scan control part 53 controls the stage moving mechanism 31, the irradiation unit moving mechanism 32, the stage rotation mechanism 222 and various constituent elements in the irradiation part 40 described later.

The control part 5 is further provided with a correcting operation part 54 for correcting positions of irradiation regions on the substrate 9, a size of a projected image of the DMD in the irradiation part 40 and the like. The correcting operation part 54, receiving a signal from the irradiation unit 4, performs an arithmetic operation and outputs a signal for correction of irradiation to the irradiation control part 52 and the scan control part 53.

Figure 2:
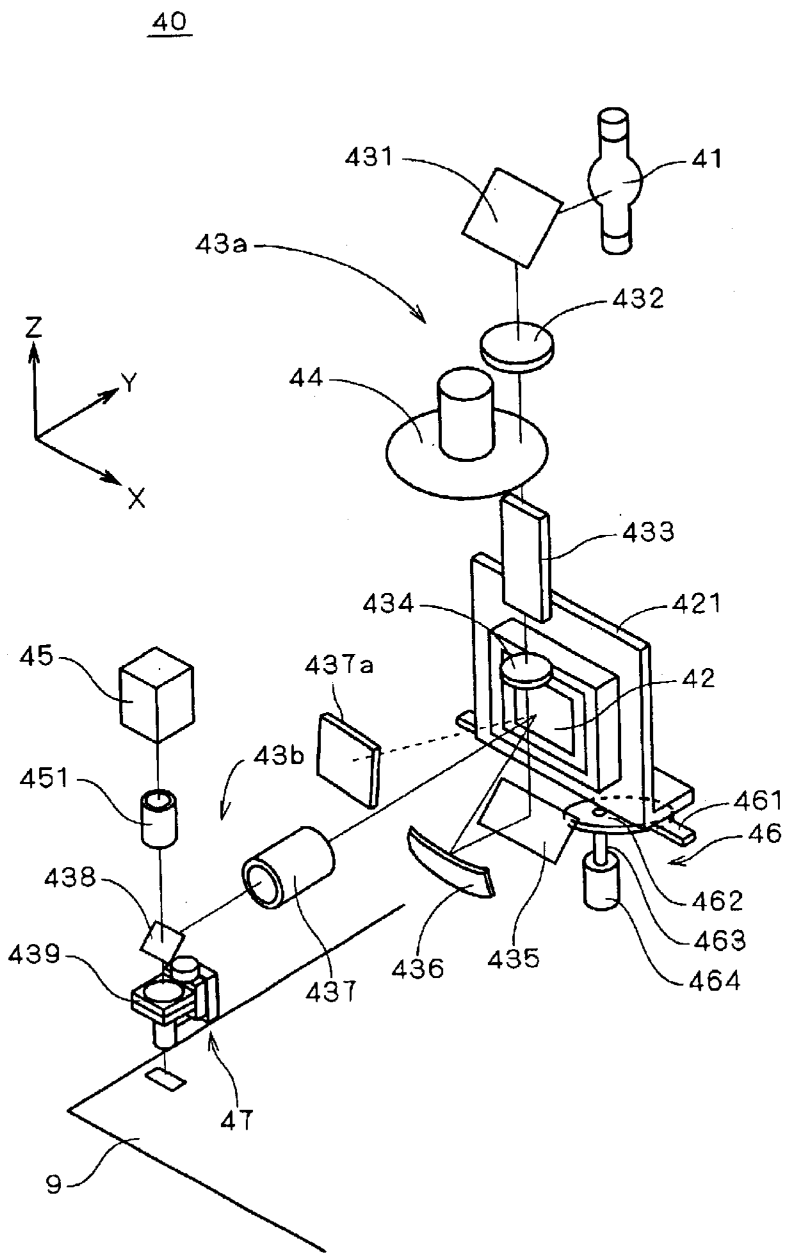
FIG. 2 is a view showing an internal structure of an irradiation part.

FIG. 2 is a view showing an internal structure of the irradiation part 40. The irradiation part 40 has a light source 41 which is a lamp for emitting a light and a DMD 42 provided with a group of micromirrors arrayed in a lattice arrangement, and the group of micromirrors reflect the light beam from the light source 41 to output a spatially-modulated light beam.

Specifically, light emitted from the light source 41 which is an ultra high pressure mercury lamp (a semiconductor laser, an LED or the like may be used) are guided by a mirror 431 and a lens 432 to a light control filter 44 where the light beam is controlled to have a predetermined amount of light (light intensity). The light beam through the light control filter 44 are guided through a rod integrator 433, a lens 434 and a mirror 435 to a mirror 436 where the light beam is condensed and guided to the DMD 42. The light beam entering the DMD 42 is uniformly emitted to the group of micromirrors of the DMD 42 at a predetermined incident angle. Thus, the mirror 431, the lens 432, the rod integrator 433, the lens 434, the mirror 435 and the mirror 436 constitute an illumination optical system 43*a* which guides the light from the light source 41 to the DMD 42.

The light beam formed of only the reflected light beam elements from some of the micromirrors in the DMD 42 which are at a predetermined position (i.e., a light beam which is spatially modulated) enter a zoom lens 437 and are guided through a half mirror 438 to a projector lens 439 with its reduction (or magnification) rate controlled by the zoom lens 437. Then, the light beam from the projector lens 439 are emitted to regions on the substrate 9 which are optically conjugate with respect to the group of micromirrors. Thus, in the pattern writing apparatus 1, the zoom lens 437, the half mirror 438 and the projector lens 439 constitute a projection optical system 43*b* which guides the light from the micromirrors to corresponding microscopic regions on the substrate 9.

The irradiation part 40 is further provided with an image pickup part 45 and an image pickup of the region on the substrate 9 where the light from the DMD 42 is guided is performed through the projector lens 439, the half mirror 438 and the lens 451. An image pickup device of the image pickup part 45 converts the image of the region on the substrate 9 into an electric signal (i.e., image data) and transmits the electric signal to the control part 5 (see FIG. 1).

The irradiation part 40 is further provided with a micro moving mechanism 46, and the micro moving mechanism 46 moves a DMD support plate 421 on which the DMD 42 is attached in the X direction of FIG. 2 with respect to the irradiation unit 4 (more exactly, with respect to the coordinates fixed on the irradiation unit 4). The micro moving mechanism 46 has a shaft 463 having one end to which an eccentric cam 462 is attached and the other end to which a motor 464 is connected. When the motor 464 rotates, the eccentric cam 462 rotates while being in contact with a roller (not shown) attached to a lower portion of the DMD support plate 421 and the DMD support plate 421 is thereby moved along a guide rail 461 in the X direction.

By providing the respective micro moving mechanisms 46 in the irradiation parts 40, respective irradiation positions with respect to the irradiation unit 4 (respective center positions of the respective regions irradiated with the spatially-modulated light beams with respect to the irradiation unit 4) can be moved independently from one another in a direction almost orthogonal to the main scan direction and intervals of a plurality of irradiation positions can be thereby arbitrarily changed.

The projector lens 439 is attached to a projector lens moving mechanism 47 having a motor, a ball screw, a guide rail and the like, and the projector lens 439 is moved in the Z direction of FIG. 2 by driving the projector lens moving mechanism 47. Then, with the projector lens moving mechanism 47, a distance between the projector lens 439 and the substrate 9 is so controlled as to form an image of the DMD 42 on the substrate 9.

Figure 3:
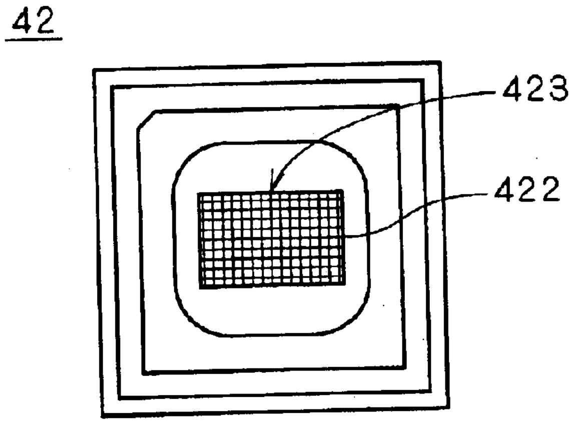
FIG. 3 is a view showing a DMD.

FIG. 3 is a view showing the DMD 42. The DMD 42 is a spatial light modulator having a group of micromirrors 423 in which a lot of micromirrors are arrayed in a lattice arrangement on a silicon substrate 422, and each micromirror is inclined by a predetermined angle by the action of static electric field in accordance with data written in a memory cell corresponding to the micromirror.

When a reset pulse is inputted from the irradiation control part 52 of FIG. 1 to the DMD 42, each of micromirrors is simultaneously inclined to a predetermined position (or orientation) with respect to an axis of diagonal line of a reflecting surface in accordance with the data written into the memory cell corresponding to the micromirror. The light beam emitted to the DMD 42 are reflected in accordance with the directions in which the micromirrors are inclined, to switch between ON and OFF of light emission to the microscopic irradiation regions corresponding to the micromirrors. In other words, when a micromirror corresponding to a memory cell into which data indicating ON is written receives the reset pulse, a light entering the micromirror is reflected to the zoom lens 437 and emitted to a corresponding irradiation region. When the micromirror comes into an OFF state, the micromirror reflects an incident light to a predetermined position (light cutoff plate 437*a*, see FIG. 2) different from the zoom lens 437, to prevent the light from being guided to the corresponding irradiation region.

As this DMD 42, for example, used is a device in which the micromirrors are arranged in a matrix with 768 rows and 1024 columns, and when a reset pulse is inputted thereto, each micromirror is inclined to either position of (+10) degrees or (−10) degrees in accordance with the data in the corresponding memory cell.

Figure 4:
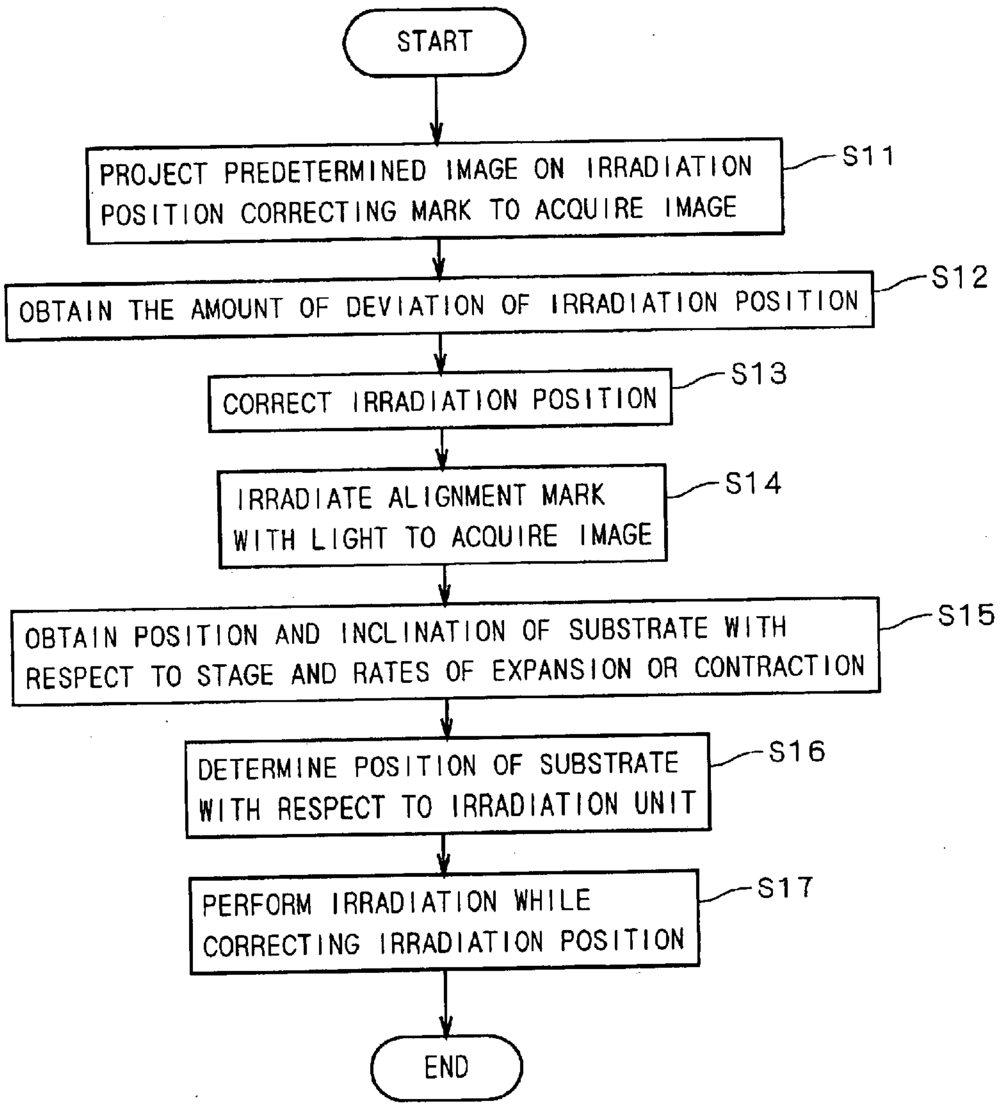
FIG. 4 is a flowchart showing an operation flow of the pattern writing apparatus.

FIG. 4 is a flowchart showing an operation flow of the pattern writing apparatus 1 for recording an image on a photoresist film on the substrate 9, and FIG. 5 is a plan view showing the irradiation unit 4, the region 23 on the stage support mount 21 and the substrate 9. In pattern writing, first, a positional relation between the irradiation position corresponding to each irradiation part 40 and the irradiation unit 4 is checked. Since a positional relation between the irradiation unit 4 and the stage 22 can be detected on the basis of outputs from the linear encoder 311 of the stage moving mechanism 31 (see FIG. 1) and an encoder of the irradiation unit moving mechanism 32, a check of the positional relation between the irradiation position and the irradiation unit 4 (hereinafter, referred to as "check of irradiation position") is substantially a check of the positional relation between the stage 22 and the irradiation position.

In checking the irradiation position, the stage 22 and the irradiation unit 4 are moved so that the irradiation positions of the irradiation parts 40 may coincide with irradiation position correcting marks 231. Subsequently, the irradiation parts 40 emit light beams to project predetermined patterns on the irradiation position correcting marks 231 and image data near the irradiation position correcting marks 231 are acquired by the image pickup parts 45 (see FIG. 2) (Step S11).

In the correcting operation part 54 of the control part 5, the amount of deviation of each irradiation position with respect to the irradiation position correcting mark 231 in the X and Y directions is calculated on the basis of the acquired image data (Step S12). The amount of deviation in the X direction corresponds to the amount of deviation of the DMD 42 with respect to the irradiation unit 4 (or the irradiation part 40) and the amount of deviation in the Y direction corresponds to the amount of deviation between the stage 22 and the irradiation part 40 in the case where the irradiation unit 4 and the stage 22 have a predetermined positional relation.

Calculating the amount of deviation, the control part 5 corrects the amount of deviation of each irradiation position (or prepares the correction) (Step S13). When the acquired amount of deviation in the X direction exceeds a predetermined range, the micro moving mechanism 46 of each irradiation part 40 is driven to correct the irradiation position with respect to the irradiation unit 4 in accordance with the amount of deviation. When the amount of deviation in the Y direction exceeds a predetermined range, the correcting operation part 54 transmits information for correction to the irradiation control part 52 and the scan control part 53. The timing of transmitting the reset pulse to the DMD 42 is thereby controlled in the pattern writing, and the irradiation positions with respect to the stage 22 are substantially corrected.

Figure 6A:
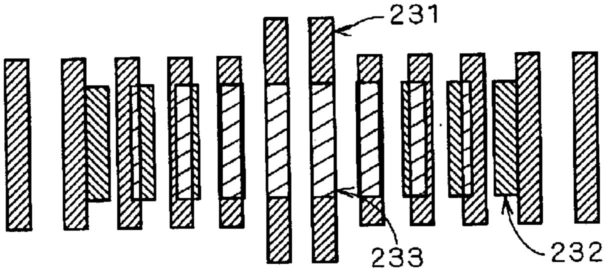
FIGS. 6A and 6B are views used for explaining acquisition of the amount of deviation of an irradiation position from an irradiation position correcting mark.
Figure 6B:
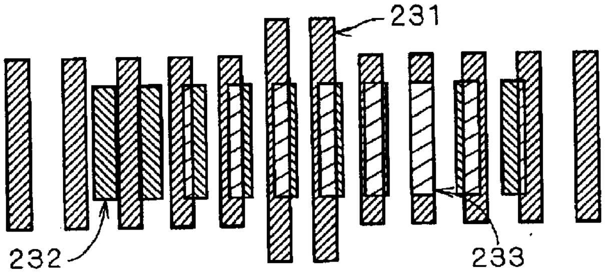

FIGS. 6A and 6B are views used for explaining acquisition of the amount of deviation of one irradiation position with respect to the irradiation position correcting mark 231. FIGS. 6A and 6B each show a state where a projected image 232 is projected on the irradiation position correcting mark 231 by the irradiation part 40. The irradiation position correcting mark 231 and the projected image 232 are each a set of strip-like regions (hereinafter, referred to as "strip region") arranged in parallel at constant intervals (so-called vernier patterns) and the respective intervals are different from each other.

The irradiation position correcting mark 231 is made of a material whose reflectance of light is relatively high in the region 23 shown in FIG. 5, the other portion of the region 23 is a surface whose reflectance is relatively low. Therefore, an image 233 (hereinafter, referred to as "detected image") indicating regions where the irradiation position correcting mark 231 and the projected image 232 overlap each other can be acquired by the image pickup part 45 of FIG. 2.

FIG. 6A shows a state where the projected image 232 is projected without being deviated from the irradiation position correcting mark 231 and FIG. 6B shows a state where the projected image 232 is deviated from the irradiation position correcting mark 231. Since-the intervals of the strip regions of the irradiation position correcting mark 231 and those of the strip regions of the projected image 232 are different from each other, as shown in FIG. 6A, when the irradiation position is not deviated, the center two ones of a plurality of strip-like regions of the detected image 233 each have the largest area. On the other hand, when the irradiation position is deviated, as shown in FIG. 6B, a region having the largest area in the detected image 233 is deviated from the center position in accordance with the amount of deviation. Therefore, on the basis of the position of a region having the largest area in the detected image 233, it is possible to detect the amount of deviation of the irradiation position in an arrangement direction of the strip regions of the irradiation position correcting mark 231.

Actually, two irradiation position correcting marks 231 whose arrangement direction of strip regions are orthogonal to each other are provided at a position on the region 23 corresponding to each irradiation part 40.

Next, the pattern writing apparatus 1 performs an alignment and positioning of the substrate 9 held on the stage 22. Specifically, the pattern writing apparatus 1 turns on all the micromirrors in the DMD 42 in a specified irradiation part 40 and controls the stage moving mechanism 31 and the irradiation unit moving mechanism 32 to emit a light beam to an alignment mark 92 formed on the substrate 9 in advance as shown in FIG. 5. The alignment mark 92 is a pattern, a hole or the like formed on a recording surface of the substrate 9.

Then, the image pickup part 45 performs an image pickup (Step S14), and the correcting operation part 54 obtains a position of the alignment mark 92 on the stage 22 from the position of the specified irradiation part 40 with respect to the stage 22 and the acquired image data (Step S15). Detection of the position of the alignment mark 92 is performed for four alignment marks 92 (not shown in FIG. 4), and from the positions of a plurality of alignment marks 92, a base position on the substrate 9 with respect to the stage 22 (for example, an irradiation start position or a center position of the substrate 9), the inclination of the substrate 9 with respect to the main scan direction and the rates of expansion or contraction of the substrate 9 in the main scan direction and the subscan direction.

When the inclination of the substrate 9 falls within a predetermined range, the control part 5 moves the position of the irradiation unit 4 in the X direction so that the base position on the substrate 9 may be located at a predetermined position with respect to the irradiation unit 4, to correct a relative position of the substrate 9 with respect to the irradiation unit 4. When the substrate 9 is inclined, the control part 5 controls the stage rotation mechanism 222 to correct the inclination of the substrate 9 and then performs an image pickup of the alignment marks 92 again to determine the position of the substrate 9 (Step S16).

When correction of the irradiation positions and positioning of the substrate 9 are finished, the pattern writing apparatus 1 performs writing of a pattern (recording of an image) on the substrate 9 with irradiation. At that time, on the basis of the amount of deviation of the irradiation positions with respect to the irradiation unit 4 (i.e., deviation in the Y direction) and the detection result of the positions of the alignment marks 92, correction of irradiation control is performed (Step S117).

In the pattern writing apparatus 1, the irradiation unit 4 inverts the main scan direction every time when one scan of the substrate 9 in the main scan direction is completed and is moved in the subscan direction to be located at a start position of next main scan. With this operation, the irradiation positions of the irradiation parts 40 are moved alternatively in the main scan direction and the subscan direction with respect to the substrate 9 as indicated by the arrows 61 of FIG. 5. Further, the control part 5 synchronizes the main scan of the irradiation position and control of the DMD 42 in each irradiation part 40, to write a pattern on the substrate 9.

Figure 7:
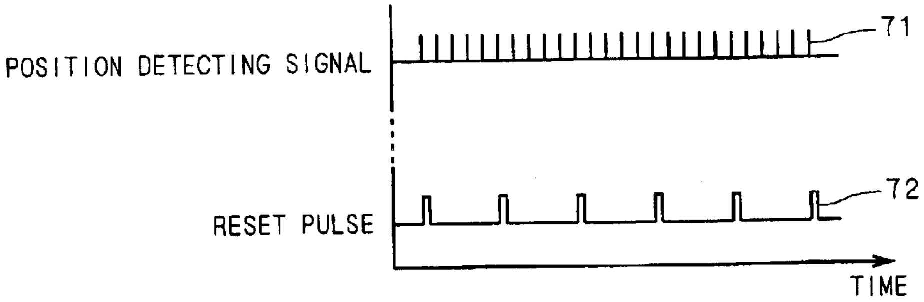
FIG. 7 is a view showing a position detecting signal and a reset pulse.

FIG. 7 is a view used for explaining an operation of the control part 5 for synchronizing the main scan of the irradiation position and output of the reset pulse to the DMD 42. In FIG. 7, the horizontal axis indicates the time and the vertical axis indicates a position detecting signal 71 transmitted from the linear encoder 311 to the control part 5 (exactly, a signal generated by demultiplying a pulse signal from the linear encoder 311) and a reset pulse 72 transmitted from the control part 5 to the DMD 42. As shown in FIG. 7, the control part 5 outputs the reset pulse 72 to the DMD 42 every time when it counts the peak of the position detecting signal 71 from the linear encoder 311 predetermined times. In other words, the control of irradiation of the light beam from the irradiation parts 40 is performed on the basis of the position detecting signal 71, to thereby synchronize the moving of the irradiation positions in the main scan direction and the driving of the DMDs 42 in the pattern writing apparatus 1.

The correction of the irradiation position in the Y direction in Step S13 of FIG. 4 is substantially carried out by shifting the start point to generate a reset pulse by demultiplying the pulses of the position detecting signal 71 for each irradiation part 40 (or generating the reset pulse 72 at a different peak).

Figure 8:
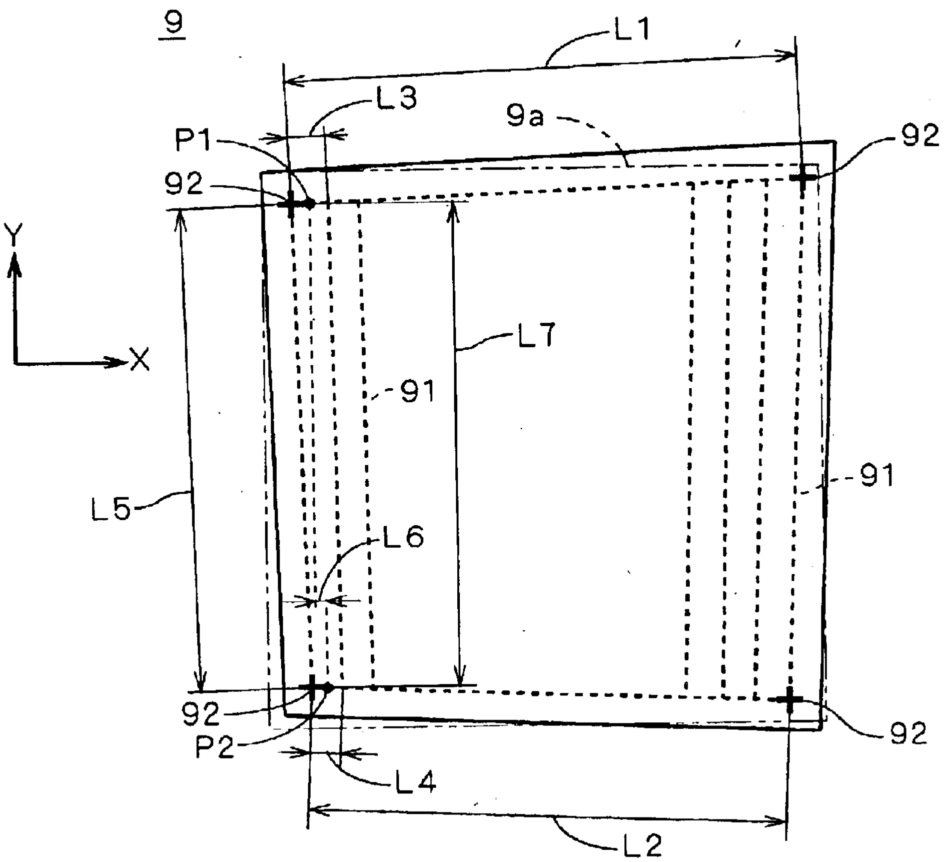
FIG. 8 is a view showing a deformed substrate.

Next, discussion will be made on correction of irradiation control in Step S17 which is performed when the substrate 9 is microscopically deformed. FIG. 8 is a view showing a deformed substrate 9. The substrate 9 is very slightly distorted from the original shape (represented by the reference sign 9*a*) in a processing of antecedent steps, for example.

In the correction of irradiation control, on the basis of the measurement result of the positions of a plurality of alignment marks 92 in Step S14, a writing start position, a writing end position and the rates of expansion or contraction of a region (hereinafter, referred to as "stripe 91") where a pattern is written by one main scan of one irradiation part 40 are obtained in advance. In writing each stripe 91, in accordance with the obtained the writing start position, the writing end position and the rates of expansion or contraction, the constituent elements of the pattern writing apparatus 1 are controlled. The rates of expansion or contraction refers to a ratios of expansion or reduction of the size of a pattern to be written to a reference size, and the rate of expansion or contraction in the X direction is considered to be continuously changed in the main scan direction (Y direction) and that in the Y direction is considered to be constant for each stripe 91 and obtained.

More specifically, with respect to the substrate 9 of FIG. 8, lengths L1 and L2 between the alignment marks 92 opposed in the X direction on the (+Y) side and the (−Y) side are obtained. Writing widths L3 and L4 of each stripe 91 at the writing start position and the writing end position, respectively, are obtained by dividing the obtained lengths L1 and L2 by the total number of the stripes 91 which is determined in advance.

It is assumed, as shown in FIG. 8, that the center position of a side on the (+Y) side of the stripe 91 on the (−X) side is the writing start position P1, the center position of a side on the (−Y) side thereof is the writing end position P2, the distance between the writing start position P1 and the writing end position P2 is L5, the distance in the Y direction is L7 and the distance in the X direction is L6.

The irradiation control part 52 and the scan control part 53 in the control part 5 first perform a positional correction by using a ΔX micro moving mechanism so that the irradiation position may be the X coordinate of the position P1, next input the reset pulse to the corresponding irradiation part 40 so that the irradiation position of the irradiation part 40 may start writing at the writing start position P1 while moving the substrate 9 in the main scan direction, and then repeatedly input the reset pulse in synchronization with the position detecting signal. At that time, the frequency demultiplication ratio for generating the position detecting signal is changed by the ratio of the actual distance L5 to the distance between the writing start position and the writing end position in the case of no deformation (or the number of counts of peaks of the position detecting signal until generation of the next reset pulse is controlled). With this operation, a writing is performed in accordance with the rate of expansion or contraction in the Y direction.

The control part 5 moves the irradiation position in the X direction by using the micro moving mechanism 46 by a distance which is (L6/L7) times as long as the distance where the irradiation position is moved from the writing start position P1 in the main scan direction (Y direction). The magnification (including reduction) of the zoom lens 437 is so continuously changed from that at the writing start position P1 to that at the writing end position P2 as to be changed linearly with respect to the distance where the irradiation position is moved from the writing start position P1 in the main scan direction (Y direction). The magnifications at the writing start position P1 and the writing end position P2 are obtained from the ratios of the lengths L3 and L4 to the length of the stripe in the X direction in the case of no deformation, respectively.

While the irradiation control with respect to the stripe 91 on the (−X) side has been discussed above, the same correcting operations as above are performed in parallel for a plurality of irradiation parts 40 in the pattern writing apparatus 1. This achieves the irradiation control, which responds to a large-size substrate or refinement of patterns.

In the pattern writing apparatus 1, since the distance where the irradiation position is moved by the micro moving mechanism 46 in the subscan direction, the rate of magnification or reduction of the projected image of the DMD 42 by the zoom lens 437 (in other words, variation in size of the irradiation region) and the timing of transmission of the reset pulse can be controlled for each irradiation part 40 independently in synchronization with the scanning, it is possible to perform an appropriate writing of pattern for a plurality of stripes 91 even if the stripes 91 have different shapes due to deformation. As a result, it is possible to write a desired fine pattern for a deformed substrate 9 with high precision at high speed.

When the substrate 9 having a size of 500 mm×600 mm has uniform rate of expansion or contraction of about ±0.005% in the X and Y directions due to deformation, for example, the amounts of deformation of the substrate 9 in horizontal and vertical directions are ±25 μm and ±30 μm, respectively. Assuming that the total number of the stripes 91 is 80 herein, the amount of deformation in width of one stripe 91 is ±0.31 μm or ±0.38 μm.

When the amount of deformation falls within this range and pattern writing with high precision is not required, it is not always necessary to perform correction of magnification of the zoom lens, continuous moving by the micro moving mechanism during the main scan nor the irradiation correcting control such as correction of inclination discussed later, the magnifying or reducing correction in the X direction can be performed by positional correction of the micro moving mechanism and control in the amount of moving of the irradiation unit, and the magnifying or reducing correction in the Y direction can be performed by controlling the timing of the reset pulses. When the rate of expansion or contraction is large, to the extent of about ±0.05%, or pattern writing with high precision of 0.5 μm or less is required, the pattern writing apparatus 1 controls the irradiation parts 40 independently from one another and performs correction of magnification of the zoom lens, and thereby joins a plurality of stripes 91 with high precision while appropriately expanding or contracting the pattern, to achieve writing of a fine pattern.

Since the pattern writing apparatus 1 can control the magnification and reduction of the projected images and change the distances between a plurality of irradiation positions, it is possible to perform writing a pattern, being partially magnified or reduced, on the substrate 9 without changing the writing data.

Since the image of the DMD 42 is projected, being reduced, by the projection optical system 43_b_, the distance of the DMD 42 moved by the micro moving mechanism 46 can be made larger than the moving distance of the irradiation position in the subscan direction and it is thereby possible to easily perform correction control for moving the irradiation positions in the subscan direction (X direction) with high precision.

Figure 9:
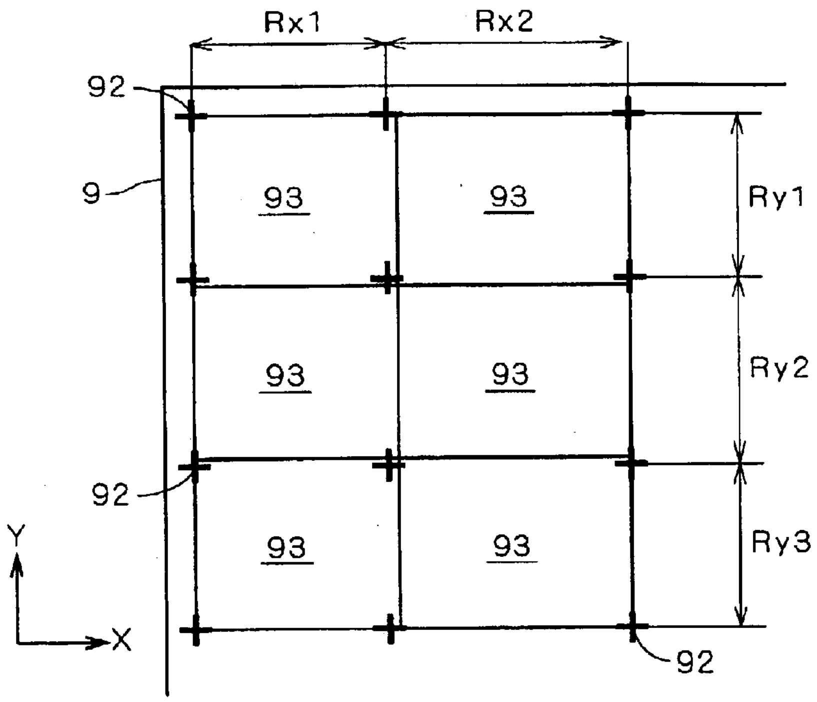
FIG. 9 is a view showing sections of a writing region.
Figure 10:
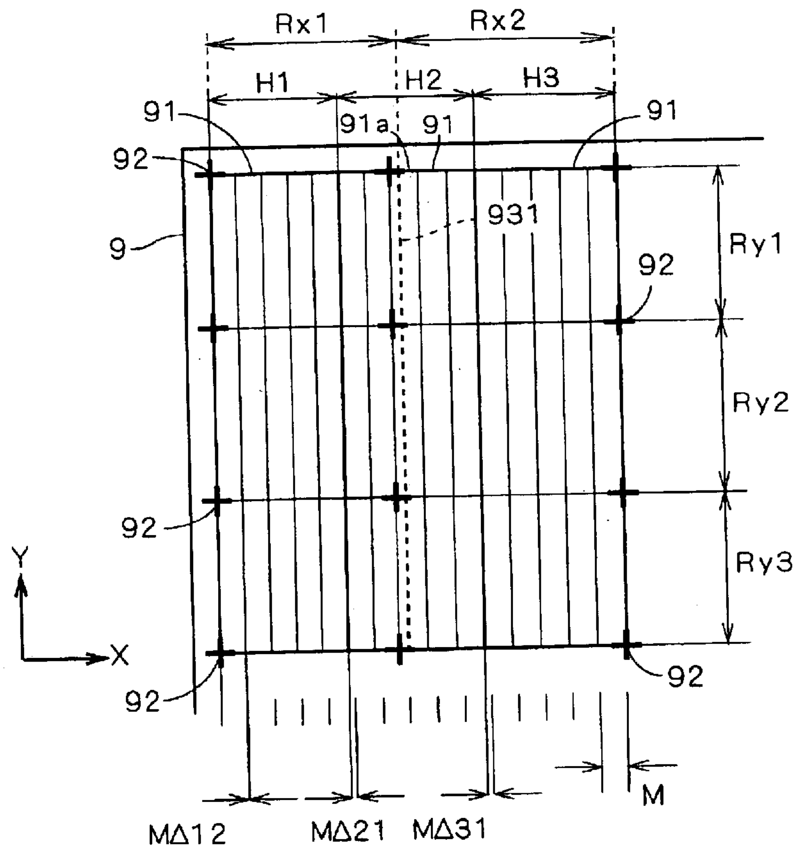
FIG. 10 is a view showing stripes on the writing region.

Next, discussion will be made on a specific case where moving of the DMD 42, control of the zoom lens 437 and generation of the reset pulses are performed independently from one another in each irradiation part 40. In this discussion, it is assumed that the a writing region on the substrate 9 where a pattern is written is divided into sections 93 of 2×3 as shown in FIG. 9 and three irradiation parts 40 each perform five main scans (in other words, each irradiation part 40 performs writing on five stripes 91 as shown in FIG. 10) to achieve a writing on all of the region. The ranges H1, H2 and H3 of FIG. 10 represent ranges where the irradiation parts 40 on the (−X) side, at the center and on the (+X) side perform writings, respectively.

Figure 11:
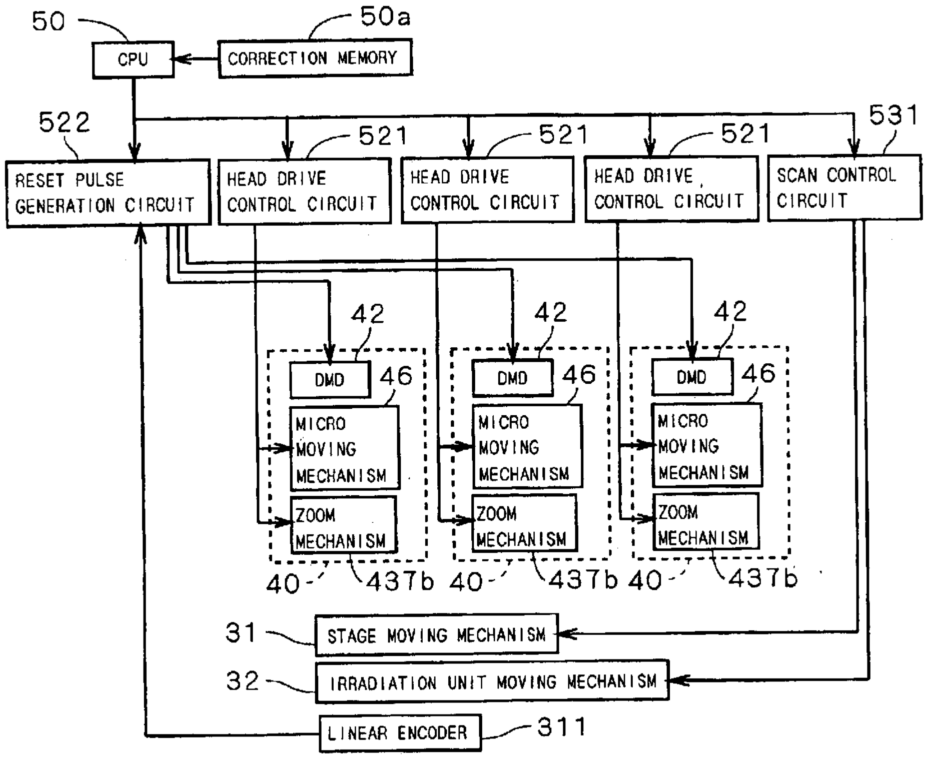
FIG. 11 is a block diagram showing a constitution of the pattern writing apparatus.

FIG. 11 is a block diagram showing a constitution of the pattern writing apparatus 1 having three irradiation parts 40. In FIG. 11, each head drive control circuit 521 individually generates a control signal to be transmitted to the micro moving mechanism 46 and a zoom mechanism 437_b_ for zooming the zoom lens 437 in the irradiation part 40 under the control of a CPU 50. A reset pulse generation circuit 522 generates reset pulses to be transmitted to each DMD 42 in accordance with a signal from the linear encoder 311 under the control of the CPU 50. The irradiation control part 52 of FIG. 1 corresponds to a function which is achieved by the CPU 50, the head drive control circuits 521 and the reset pulse generation circuit 522. A scan control circuit 531 generates a control signal to be transmitted to the stage moving mechanism 31 and the irradiation unit moving mechanism 32 under the control of the CPU 50. The scan control part 53 of FIG. 1 corresponds to a function which is achieved by the CPU 50 and the scan control circuit 531.

The correcting operation part 54 of FIG. 1 corresponds to the CPU 50 and a correction memory 50_a_, and correction data is obtained in advance through arithmetic operation of the CPU 50 and the like as discussed later and stored in the correction memory 50*a* and when the writing is performed, the correction data is sequentially transmitted from the correction memory 50*a* to the CPU 50.

Figure 12:
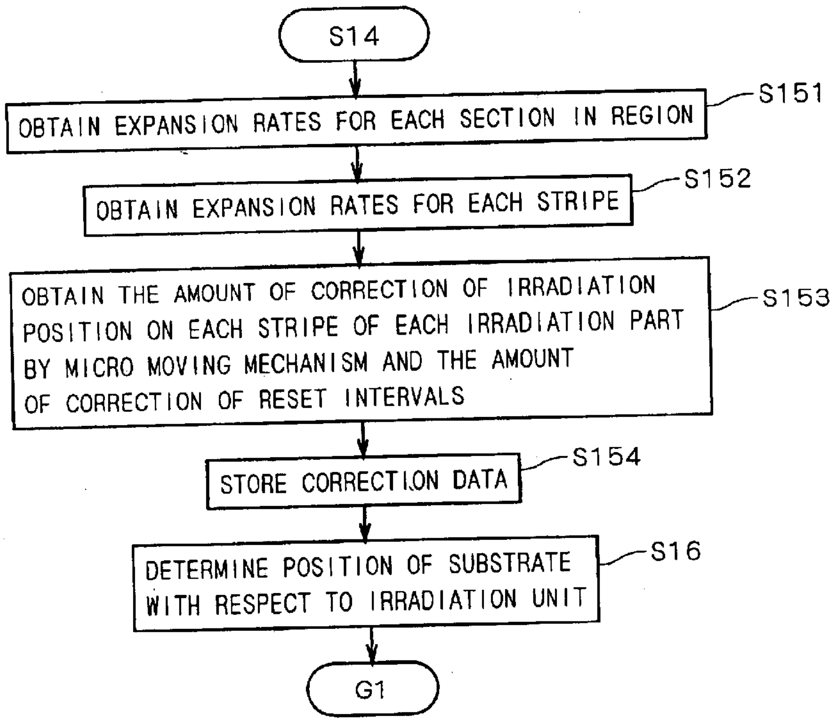
FIGS. 12 and 13 are flowcharts showing an operation flow of the pattern writing apparatus.
Figure 13:
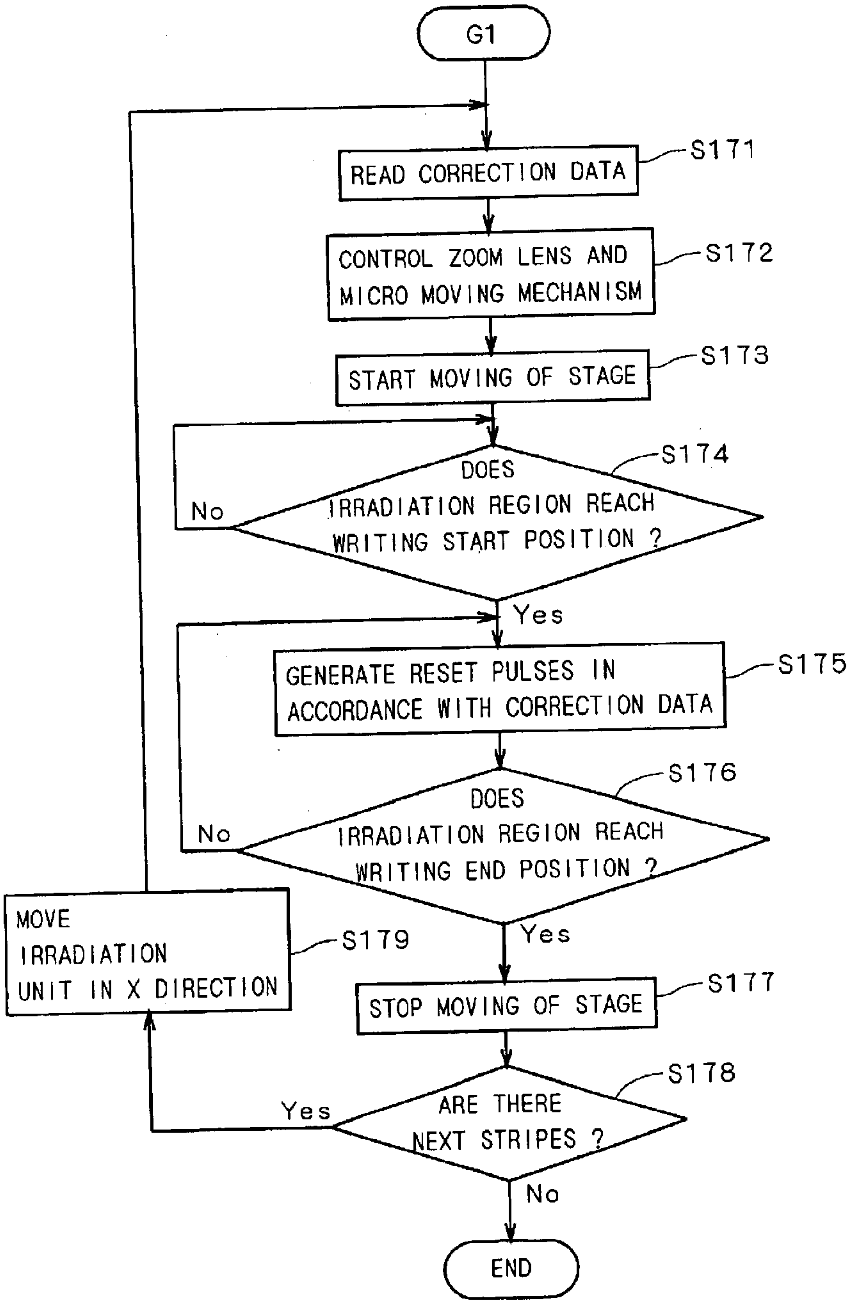

FIGS. 12 and 13 are flowcharts showing an operation flow of the pattern writing apparatus 1 for performing writing on the writing region of FIG. 9, and this flow corresponds to Steps S15 to S17 of FIG. 4. First, the irradiation positions are corrected (Steps S11 to S13 of FIG. 4), and when the positions of the alignment marks 92 are detected (Step S14), rates of expansion or contraction (hereinafter, referred to as "expansion rate") din the X and Y directions are obtained for each section 93 through the arithmetic operation of the CPU 50 (Step S151 of FIG. 12). Further, expansion rates in the X and Y directions are obtained for each stripe 91 of FIG. 10 (Step S152).

It is assumed, for example, that the expansion rates of the substrate 9 in the X direction in the ranges Rx1 and Rx2 of FIG. 9 are βx1 and βx2, respectively, the expansion rates of the substrate 9 in the Y direction in the ranges Ry1, Ry2 and Ry3 are βy1, βy2 and βy3, respectively, and the substrate 9 has no shear deformation. In this case, the rates βy1, βy2 and βy3 are determined for each stripe 91 of FIG. 10 as the expansion rates in the Y direction with respect to the ranges Ry1, Ry2 and Ry3, respectively.

On the other hand, since all the stripes 91 in the range H1 are included in the range Rx1, the expansion rates of the stripes in the X direction are βx1, and since all the stripes 91 in the range H3 are included in the range Rx2, the expansion rates of the stripes in the X direction are βx2. In the range H2, since the first and second stripes 91 from the (−X) side are completely included in the range Rx1, the expansion rates in the X direction are βx1, and since the fourth and fifth stripes 91 from the (−X) side are completely included in the range Rx2, the expansion rates in the X direction are βx2. With respect to the third stripe 91*a* from the (−X) side, since the boundary 931 between the ranges Rx1 and Rx2 is located closer to the (−X) side from the center, the expansion rate in the X direction is βx2. Though it is preferable that the expansion rate the third stripe 91*a* in the X direction should be obtained by interpolating the rates βx1 and βx2 on the basis of the position of the boundary 931, if the error affects little, the expansion rate may be determined as βx1 or βx2 without the above interpolation.

Next, obtained are the amounts of correction of the irradiation positions in the X direction by the micro moving mechanisms 46 in the writing on the stripes by the irradiation parts 40 (the first half of Step S1153). As shown in FIG. 10, the amount of one moving of the irradiation unit 4 in X direction is a distance M obtained by dividing the width of the writing region in the X direction by the number of stripes 91. In contrast to this, since the width of each stripe 91 in the X direction is determined by multiplying the distance M by the expansion rate, when writing is performed on the n-th stripe 91 from the (−X) side in FIG. 10, the difference between the position of the n-th stripe 91 on the (−X) side and a position away from the alignment mark 92 on the (−X) side by the distance which is (n−1) times as long as the distance M is obtained as the amount of correction by the micro moving mechanism 46. In FIG. 10, the reference signs MΔ12, MΔ21 and MΔ31 represent the amounts of correction of the irradiation positions by the micro moving mechanisms 46 in the writing on the second stripe 91 by the irradiation part 40 on the (−X) side, the first stripe 91 by the center irradiation part 40 and the first stripe 91 by the irradiation part 40 on the (+X) side, respectively.

Figure 14A:
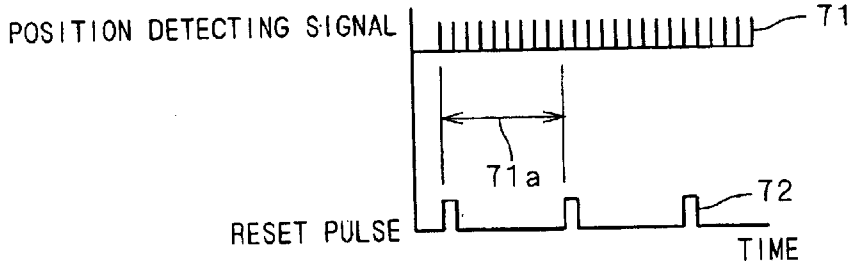
FIGS. 14A and 14B are views each showing a position detecting signal and a reset pulse.
Figure 14B:
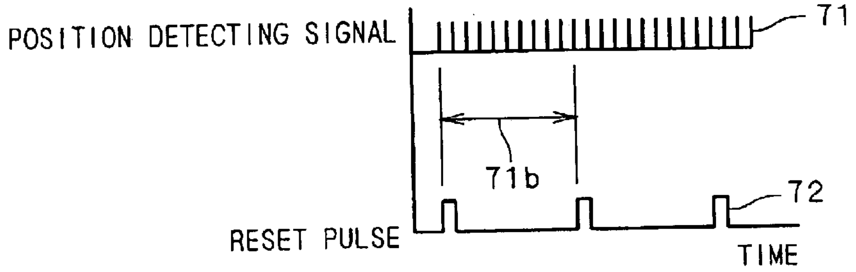

Subsequently obtained are the amounts of correction of interval for generation of the reset pulses in the writing on the stripes 91 on the basis of the expansion rates of the stripes 91 in the Y direction (the second half of Step S153). FIGS. 14A and 14B are views showing correction of the interval of the reset pulses 72 (in other words, the number of counts of the position detecting signal 71). FIG. 14A shows a state where the reset pulse 72 is generated at an interval 71*a* of nine pulses of the position detecting signal 71, and FIG. 14B shows a state where the reset pulse 72 is generated at an interval 71*b* of ten pulses of the position detecting signal 71. For example, in FIG. 10, when the expansion rate of the stripe 91 in the range Ry2 is larger than that of the stripe 91 in the range Ry1 by about 10% and the reset pulses 72 of FIG. 14A are used in the writing of the range Ry1, the reset pulses 72 of FIG. 14B are used in the writing of the range Ry2. When the expansion rate of the stripe 91 in the range Ry2 is different from that of the stripe 91 in the range Ry1 by not more than 10%, the intervals for generation of the reset pulses 72 of FIGS. 14A and 14B are mixed in accordance with the expansion rate of the stripe 91 in the range Ry2. This achieves the writing in accordance with the expansion rate in the Y direction. Actually, the expansion rate in the Y direction is accurately obtained for each stripe 91, the amount of correction of the intervals of the reset pulses are obtained for each stripe 91 and the respective reset pulses for the irradiation parts 40 are generated independently from one another.

The expansion rate of each stripe 91 in the X direction, the amounts of correction of each irradiation position by the micro moving mechanism 46 and the amounts of correction of the intervals of the reset pulses are stored in the correction memory 50*a* of FIG. 11 as correction data (Step S154). Then, the initial position of the substrate 9 with respect to the irradiation unit 4 is determined, by which preparation of pattern writing is completed (Step S16).

When the writing (image recording) is actually performed, first, the expansion rate in the X direction and the amount of correction by the micro moving mechanism 46 among the correction data on the first stripe 91 of each irradiation part 40 are read out (Step S171), each zoom mechanism 437*b* is individually controlled in accordance with the expansion rate to set the magnification of the zoom lens 437, and the size of the irradiation region corresponding to the irradiation part 40 is changed. Each micro moving mechanism 46 corrects the position of the DMD 42 in the X direction by the amount of correction (Step S172).

After that, the moving of the stage 22 in the Y direction is started (Step S173). At this time, the light source 41 is ON and all the micromirrors of the DMD 42 are in the OFF state. Then, when the position to be irradiated with a light beam reaches the writing start position of each stripe 91 (Step S174), the CPU 50 generates the reset pulse while sequentially reading the amounts of correction of the intervals for generation of the reset pulses in the correction data, and the writing is thereby performed by the DMD 42 (Step S175).

When the irradiation position reaches the writing end position of each stripe 91 (Step S176), all the micromirrors of the DMD 42 are turned OFF and the moving of the stage 22 is stopped (Step S177), and if there are next stripes 91, the whole irradiation unit 4 is moved in the (+X) direction by the predetermined distance M (Steps S178 and S179). Then, going back to Step S171, after controlling the zoom lens 437 and the micro moving mechanism 46, the writings in consideration of the expansion rate in the Y direction are performed (Steps S171 to S177). Repeating the step movings of the irradiation unit 4 in the (+X) direction and the writings, when the writing on all the stripes 91 by all the irradiation parts 40 are completed, the pattern writing is finished (Step S178).

Thus, in the pattern writing apparatus 1, since each irradiation part 40 is provided with the zoom lens 437, the micro moving mechanism 46 and the DMD 42 which can be controlled independently from other irradiation parts 40, it is possible to achieve pattern writing with high precision at high speed.

Though discussion has been made on the case of no shear deformation in the substrate 9 in the operation of FIGS. 12 and 13, even if the substrate has shear deformation, it is possible to achieve pattern writing with high precision by controlling the zoom lens 437 and the micro moving mechanism 46 in accordance with the moving of the stage 22 in the Y direction.

FIG. 15 is a view showing another exemplary structure of the irradiation part 40, and this figure shows only the neighborhood of the half mirror 438. In the irradiation part 40 of FIG. 15, an image rotation prism 46*a* having a microrotation mechanism 46*b* is provided between the half mirror 438 and the zoom lens 437.

The light beam passing through the zoom lens 437 goes through the image rotation prism 46*a* and forms an image of the DMD 42 on the substrate 9, and in this case, by rotating the image rotation prism 46*a* by a rotation of θ with the microrotation mechanism 46*b*, the projected image is rotated by a rotation of 2θ.

By rotating the prism 46*a* with image so rotated as to correct the angle of inclination of the substrate 9 which is obtained by the correcting operation (Step S15 of FIG. 4) with the above-discussed alignment marks, the projected image of the DMD 42 formed on the substrate 9 with the light beam emitted from each irradiation part 40 is individually rotated and the writing can be thereby performed without rotating the substrate 9 in the above-discussed positioning (Step S16 of FIG. 4).

Though the preferred embodiment of the present invention has been discussed above, the present invention is not limited to the above-discussed preferred embodiment, but allows various variations.

The spatial light modulator provided in the pattern writing apparatus 1 is not limited to the DMD 42, but, for example, a diffraction grating type spatial light modulator (so-called GLV), a liquid crystal shutter or the like may be used. Further, the pattern writing may be performed, with arrangement of a plurality of light emitting elements such as light emitting diodes or semiconductor lasers used as the light source, by controlling ON/OFF of the light emitting elements in synchronization with the scanning.

It is not needed that the light beam to be emitted from the irradiation part 40 to the substrate 9 should be spatially modulated (in other words, should be a set of modulated microscopic beams), and the pattern writing apparatus 1 may be provided with a lot of irradiation parts 40 each emitting one microscopic light beam which can be ON/OFF controlled.

The micro moving mechanism 46 in the above preferred embodiment is only one example, and as shown in FIG. 16, for example, the micro moving mechanism 46 may have a constitution where a motor 465, a guide rail 466 and a ball screw (not shown) serve to move the DMD support plate 421. Alternatively, the DMD support plate 421 may be moved by a piezo element, a linear motor or the like.

The image pickup part 45 is not necessarily provided in each irradiation part 40, but in order to detect the positions of the alignment marks 92 on the substrate 9 with respect to the stage 22, the image pickup part 45 only has to be provided in at least one irradiation part 40. In this case, a plurality of image pickups are performed, as necessary, while the substrate 9 is moved.

In the viewpoint of detecting the positions of the alignment marks 92 at high speed, it is preferable that the image pickup part 45 should be provided in at least two irradiation parts 40 and the lights from at least two points on the substrate 9 should be received at the same time. The control part 5 can thereby obtain the position of the substrate 9, the inclination thereof in the main scan direction, the rates of expansion or contraction of each stripe or the like on the basis of the output from the image pickup parts 45, to control the constituent elements such as the micro moving mechanism 46, the prism 46*a* and the microrotation mechanism. The image pickup part 45 may be provided outside the irradiation part 40.

Instead of the image pickup part 45, a photodetector element for detecting the intensity of light may be provided. For example, since the intensity of the reflected light is detected by the photodetector element while the irradiation part 40 sequentially projects strip-like projection patterns (strip-like projection patterns constituting the projected image 232) formed by the DMD onto the irradiation position correcting mark 231 of FIGS. 6A and 6B, it is possible to obtain the amount of deviation of the irradiation position on the basis of the position of the projection pattern whose intensity of the reflected light is the highest.

Figure 17A:
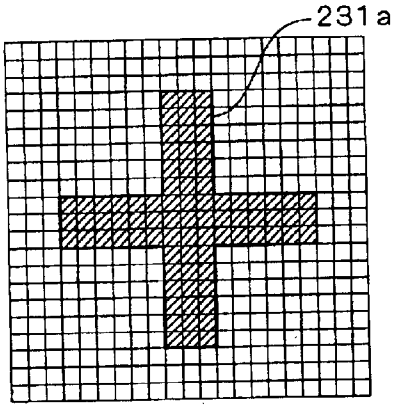
FIGS. 17A to 17C are views used for explaining acquisition of the amount of deviation of an irradiation position from the irradiation position correcting mark.
Figure 17B:
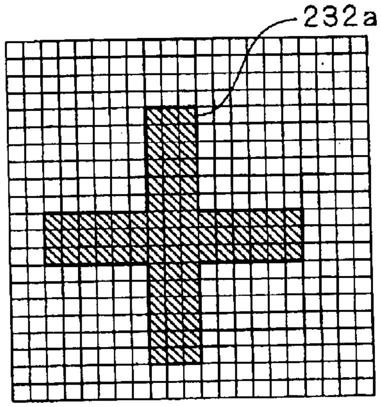
Figure 17C:
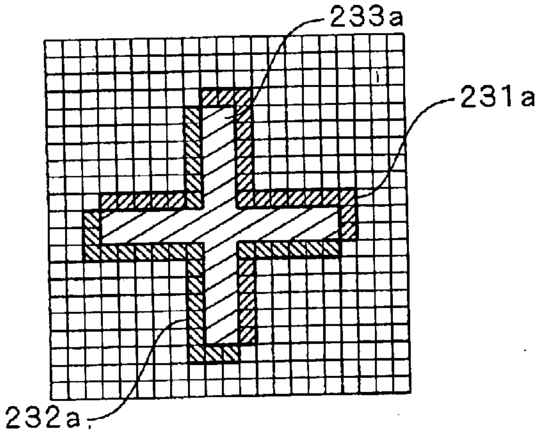

The irradiation position correcting mark may have any shape other than the shape shown in the above preferred embodiment. For example, a cross-shaped irradiation position correcting mark 231*a* as shown in FIG. 17A may be used. In this case, a projected image 232*a* shown in FIG. 17B is projected by the irradiation part 40 on the irradiation position correcting mark 231*a* and a detected image 233*a* shown in FIG. 17C is obtained by the image pickup part 45. Then, the correcting operation part 54 of the control part 5 obtains barycentric coordinates or edges of the detected image 233*a*, to calculate the irradiation position of each irradiation part 40 and the amounts of deviation in the X and Y directions.

The relative moving of the stage unit 2 and the irradiation unit 4 in the main scan direction and the subscan direction (in other words, the relative moving of the substrate 9 and the irradiation position) may be performed by the moving of either the stage unit 2 or the irradiation unit 4.

The method of obtaining the writing start position, the writing end position and the rates of expansion or contraction of each stripe 91 with respect to the deformed substrate 9 is not limited to the one discussed above in the preferred embodiment, but operation methods which reflect the deformation more ideally may be used.

The fine adjustment of the irradiation position in the X direction (the subscan direction) may be performed by other methods. For example, the fine adjustment can be performed by slightly moving the projector lens 439 and the zoom lens 437 in the X direction.

While the invention has been shown and described in detail, the foregoing description is in all aspects illustrative and not restrictive. It is therefore understood that numerous modifications and variations can be devised without departing from the scope of the invention.

What is claimed is:

1. A pattern writing apparatus for writing a pattern by irradiating a photosensitive material with light modulated on the basis of image data, comprising:

an irradiation unit which comprises a plurality of irradiation parts for irradiating a photosensitive material with a plurality of light beams each of which is modulated;

a scanning mechanism for scanning said photosensitive material relatively to said irradiation unit while said photosensitive material is irradiated with said plurality of light beams; and an irradiation position control mechanism for changing intervals of a plurality of irradiation positions corresponding to said plurality of irradiation parts in a direction almost orthogonal to a scan direction of said photosensitive material.

2. The pattern writing apparatus according to claim 1, wherein said irradiation position control mechanism moves said plurality of irradiation positions independently from one another.

3. The pattern writing apparatus according to claim 1, further comprising a mechanism for moving said irradiation unit in a direction almost orthogonal to said scan direction of said photosensitive material.

4. The pattern writing apparatus according to claim 1, wherein each of said plurality of irradiation parts comprises a zoom lens.

5. The pattern writing apparatus according to claim 4, wherein said zoom lens of each of said plurality of irradiation parts is controlled independently from those of other irradiation parts.

6. The pattern writing apparatus according to claim 1, further comprising a position sensor for detecting a scanning position of said scanning mechanism, wherein emission of said plurality of light beams from said plurality of irradiation parts are controlled on the basis of an output of said position sensor.

7. The pattern writing apparatus according to claim 1, wherein each of said plurality of irradiation parts comprises:

a light source;

a spatial light modulator for spatially modulating a light from said light source; and an optical system for guiding a light beam from said spatial light modulator to said photosensitive material.

8. The pattern writing apparatus according to claim 7, wherein said irradiation position control mechanism comprises a mechanism for moving at least said spatial light modulator relatively to said irradiation unit.

9. The pattern writing apparatus according to claim 7, wherein said spatial light modulator is a digital micromirror device.

10. The pattern writing apparatus according to claim 7, wherein said irradiation position control mechanism comprises a mechanism for individually rotating a projected image of said spatial light modulator formed on said photosensitive material with a light beam emitted from each of said plurality of irradiation parts.

11. The pattern writing apparatus according to claim 1, further comprising a photoreceptor for receiving a light from at least one of said plurality of irradiation positions.

12. The pattern writing apparatus according to claim 11, wherein said photoreceptor receives lights from at least two positions on said photosensitive material irradiated with light beams, and said irradiation position control mechanism is controlled on the basis of an output of said photoreceptor.

13. The pattern writing apparatus according to claim 11, wherein a positional relation between said plurality of irradiation positions and said irradiation unit is checked on the basis of said output of said photoreceptor.

14. A pattern writing method for writing a pattern by irradiating a photosensitive material with light modulated on the basis of image data, comprising the steps of:

changing intervals of a plurality of irradiation positions of a plurality of light beams emitted from a plurality of irradiation parts in a direction almost orthogonal to a scan direction of a photosensitive material, an irradiation unit comprising said plurality of irradiation parts, said plurality of light beams being each modulated; and scanning said photosensitive material relatively to said plurality of irradiation parts while said photosensitive material is irradiated with said plurality of light beams.

15. The pattern writing method according to claim 14, wherein said plurality of irradiation positions are moved independently from one another in said step of changing intervals of said plurality of irradiation positions.

16. The pattern writing method according to claim 14, further comprising the step of moving said irradiation unit in a direction almost orthogonal to said scan direction of said photosensitive material.

17. The pattern writing method according to claim 14, wherein a size of an irradiation region corresponding to each of said plurality of irradiation parts is changed in said step of scanning said photosensitive material.

18. The pattern writing method according to claim 17, wherein a size of an irradiation region corresponding to each of said plurality of irradiation parts is changed independently.

19. The pattern writing method according to claim 14, further comprising the steps of:

receiving lights from at least two positions on said photosensitive material irradiated with light beams; and obtaining the amounts of deviation of said plurality of irradiation positions on the basis of a result of receiving lights from said at least two positions.

20. The pattern writing method according to claim 19, wherein a positional relation between said plurality of irradiation positions and said irradiation unit on the basis of said result of receiving lights.

* * * * *